(12) United States Patent
Iskander et al.

(10) Patent No.: US 7,256,637 B2
(45) Date of Patent: Aug. 14, 2007

(54) HIGH VOLTAGE SWITCHING APPARATUS

(75) Inventors: Stephen Mark Iskander, Essex (GB); Robert Richardson, Essex (GB); Paul Andrew Gooch, Essex (GB)

(73) Assignee: E2V Technologies (UK) Limited, Chelmsford, Essex (GB)

( * ) Notice: Subject to any disclaimer, the term of this patent is extended or adjusted under 35 U.S.C. 154(b) by 0 days.

(21) Appl. No.: 10/480,527

(22) PCT Filed: Jun. 14, 2002

(86) PCT No.: PCT/GB02/02732
§ 371 (c)(1),
(2), (4) Date: Dec. 12, 2003

(87) PCT Pub. No.: WO02/103904
PCT Pub. Date: Dec. 27, 2002

(65) Prior Publication Data
US 2004/0183506 A1    Sep. 23, 2004

(30) Foreign Application Priority Data
Jun. 15, 2001 (GB) ................. 0114675.2

(51) Int. Cl.
*H03K 17/16* (2006.01)
(52) U.S. Cl. ............... 327/379; 327/538; 307/110; 363/60

(58) Field of Classification Search ........... 327/530, 327/536, 540, 259, 114, 514, 379, 384, 538; 363/59, 60, 128; 323/241, 903; 257/296, 257/532, 396; 307/108–110
See application file for complete search history.

(56) References Cited

U.S. PATENT DOCUMENTS

| | | | | |
|---|---|---|---|---|
| 3,678,362 A | * | 7/1972 | Amberger et al. | 320/166 |
| 4,394,590 A | * | 7/1983 | Honda | 327/436 |
| 4,720,668 A | * | 1/1988 | Lee et al. | 323/271 |
| 5,568,035 A | * | 10/1996 | Kato et al. | 320/166 |
| 5,594,287 A | | 1/1997 | Cameron | |
| 5,723,913 A | | 3/1998 | Weggel | |
| 5,763,962 A | * | 6/1998 | Tsurumi | 307/129 |
| 6,327,163 B1 | * | 12/2001 | Petr | 363/124 |
| 6,359,424 B2 | * | 3/2002 | Iida et al. | 323/251 |
| 6,396,332 B2 | * | 5/2002 | Richardson | 327/384 |
| 6,552,598 B2 | * | 4/2003 | Gelman | 327/453 |

FOREIGN PATENT DOCUMENTS

| | | |
|---|---|---|
| GB | 2 356 752 | 5/2001 |
| WO | WO98/12817 | 3/1998 |

* cited by examiner

Primary Examiner—Rajnikant B. Patel
(74) Attorney, Agent, or Firm—Venable LLP; Robert Kinberg; Catherine M. Voorhees

(57) ABSTRACT

A switching arrangement for a high voltage load provides high voltage pulses to the load. The switching arrangement includes switching modules, where n is typically (75). A load capacitance is Cd is required to avoid voltage overshoot at the load and is provided by a capacitance of nCd arranged in parallel with each switch.

8 Claims, 3 Drawing Sheets

HIGH VOLTAGE SWITCHING APPARATUS

BACKGROUND OF THE INVENTION

1) Field of the Invention

This invention relates to high voltage switching apparatus, and in particular, but not exclusively to a switching apparatus for providing pulses to a pulse switched load.

2) Description of Related Art

Our UK patent applications GB9929074.5 and GB9928049.7 describe a pulsed switching apparatus for an eht load such as a magnetron. A stack of FET switch modules are arranged in an oil filled chamber surrounded by four capacitors which are mounted within a plastics housing. The switch stack receives an eht supply, typically at about −55 kv and delivers a series of eht pulses to the magnetron. The switch also includes various control circuitry which operates at lt voltages. This circuitry controls functions such as triggering of the FET switches.

In these devices, when the load is switched, it is desirable for the voltage to rise smoothly to the operating voltage as shown in FIG. 1. In practice, however, there is a tendency to a voltage overshoot as shown in FIG. 2. This is because the load is not a purely resistive load but is of a non-linear nature and includes a capacitive component.

A known way of correcting for this voltage overshoot is to include a further capacitance in parallel with the load as shown in FIG. 3. In that figure, the load is shown as $R_L$, the switch as S and the added capacitance as Cd. The problem with this approach is that the added capacitance is large, typically in the order of 200 pF, expensive and very large in size. It is therefore desirable to find an alternative way of compensating for voltage overshoot.

SUMMARY OF THE INVENTION

In its broadest form, the invention distributes the load capacitance over the switches of the switch stack. More specifically, there is provided a high voltage switching arrangement for applying a pulse across a load, comprising a capacitor for providing electrical energy to the load and a switch stack for connecting the capacitor to the load, the switch stack comprising a plurality of switches arranged in series, and a plurality of load capacitances in parallel across the switches.

Preferably, each switch has a capacitance nCd in parallel across the switch, where Cd is the required additional capacitance across the load and n is the number of switches.

By arranging a capacitance nC, where n is the number of switches, across each switch in the switch stack, the effects of stray capacitances in the stack are avoided as the stray capacitances are swamped. This enables the voltage at each switch to be more closely controlled which is advantageous. Furthermore, the arrangement enables small cheap capacitors to be used with the switches instead of a single expensive and very bulky load capacitor.

BRIEF DESCRIPTION OF THE DRAWINGS

An embodiment of the invention will now be described, by way of example, and with reference to the accompanying drawings, in which.

DETAILED DESCRIPTION OF THE INVENTION

Figure 4:
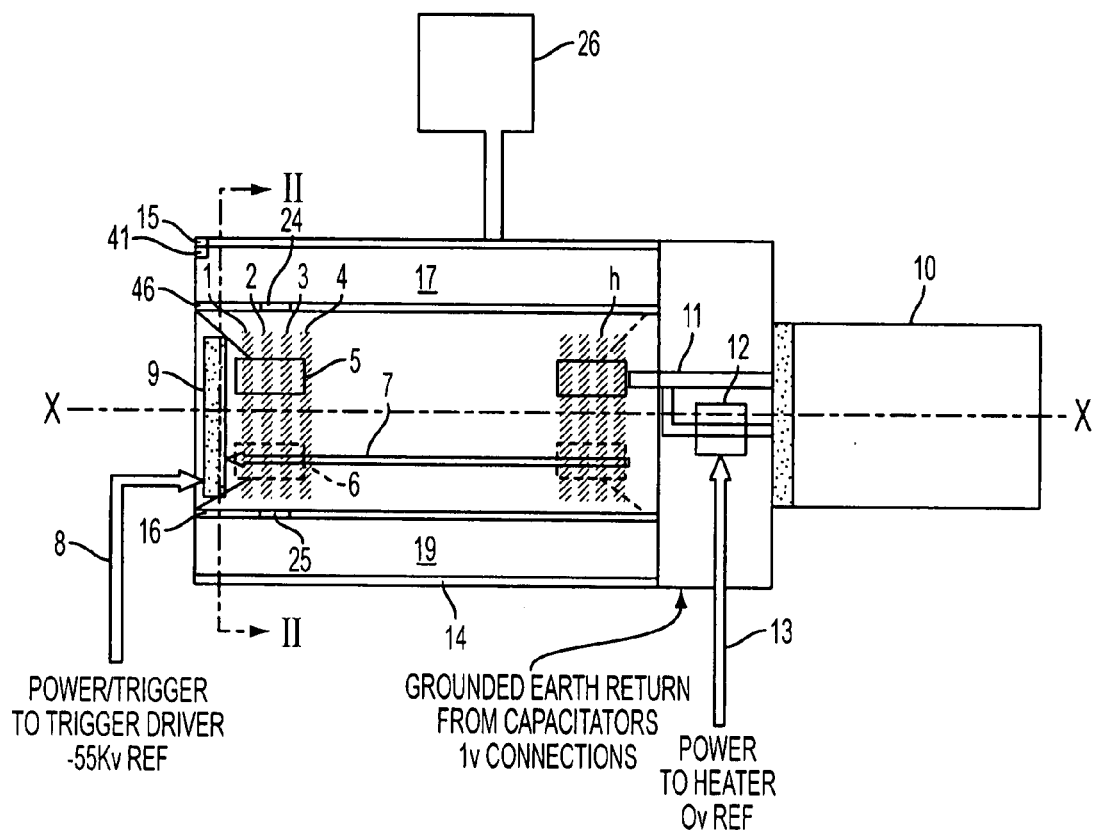
FIG. 4 is a schematic longitudinal view of a high voltage switching mechanism.
Figure 5:
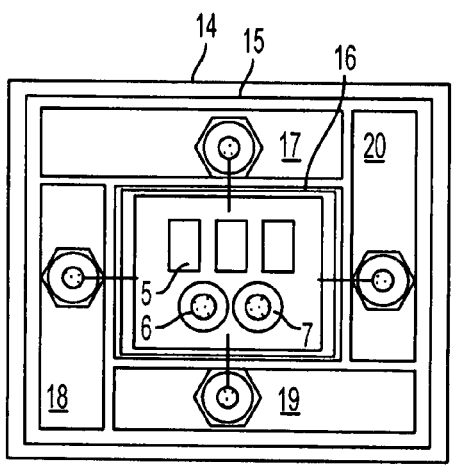
FIG. 5 is a schematic cross-section of the line V-V in FIG. 4.

FIGS. 4 and 5 show the switching mechanism disclosed in our earlier applications GB9928074.5 and GB9928049.7. The mechanism provides high voltage pulses to a high voltage load, such as a magnetron, by switching a capacitance. The switching is triggered by trigger pulses derived from a high voltage supply and the capacitance is also charged by that supply.

Figure 1:
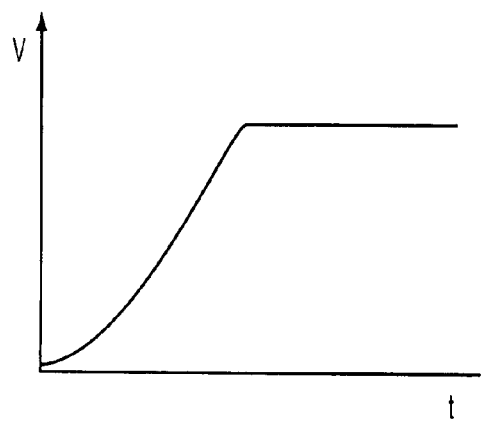
FIG. 1 (referred to previously) is a graph of voltage/time showing an ideal rise in load voltage when a switch is closed.
Figure 2:
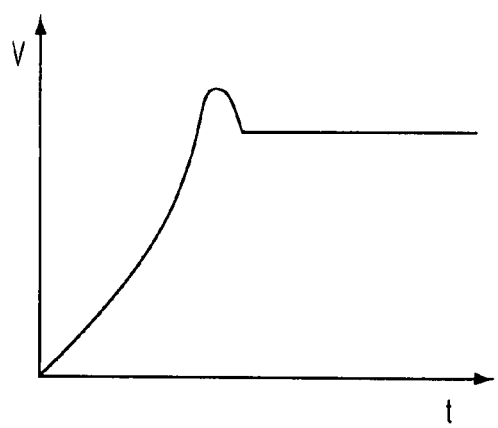
FIG. 2 (referred to previously) is a similar graph to FIG. 1 showing actual voltage rise including overshoot.

The switching arrangement shown in FIGS. 4 and 5 comprises a switch stack arranged within a chamber surrounded by a plurality of capacitances. The switch stack comprises a number of FET modules 1, 2, 3, 4, . . . n, each of which includes one or more FET switches. There may be, for example, 75 FET modules in the stack and each module may include three FET switches arranged in parallel. The modules are mounted in close proximity to one another and are stacked along the axis in FIG. 1. As well as the FET switch, each module includes a secondary transformer winding 6 with a common primary winding 7 extending along the length of the axis to act as the primary for each module. The primary is used to provide power to the FET switches. Power to the switching arrangement is applied from a source 8 to a trigger driver 9 at the high voltage end of the stack which is maintained at −55 kV. The trigger driver is formed as a module of similar dimensions to the FET modules and forms the end module of the stack. The load 10, for example a magnetron, is connected to an output 11 of the switching mechanism to receive pulses from the switching mechanism. The output 11 also provides an output 12 to a heater transformer for heating the magnetron cathode. The power for the transformer is provided from a power source 12.

The switching mechanism is arranged within a housing 14. The housing is formed of a non-conductive material such as a plastics material and comprises outer and inner walls 15, 16 defining an annular chamber therebetween, and an interior chamber 23 bounded by the inner walls and in which the switching stack is arranged. The annular chamber and the interior chamber 23 communicate via apertures 24, 25 in the inner wall 16.

As can be seen from FIG. 5, the housing and the annular and interior chambers are rectangular in cross section. Four capacitors 17 18, 19, 20 are arranged in the annular chamber, one on each side, and extend along the length of the chamber shielding the switching mechanism. The capacitors are connected at the high voltage end to the first switch module and to the load 10 at the low voltage end, which may be at ground. The capacitors each comprise a plurality of parallel plates forming capacitor elements which are interconnected so that a nominally linear voltage gradient appears from the power supply end to the zero volt end. The capacitors may each be 0.15 μf.

The unit is oil filled for heat dissipation and insulation. Oil can pass between the annular and inner chambers through passageways 24, 25. An expansion tank 26 is connected to the chambers which includes a diaphragm, and which moves with the changes in oil volume, for example due to temperature changes.

The switching stack also comprises a control module 40 which is mounted on the stack between the trigger driver module and the first FET-module 1 and which is of similar dimensions to the FET modules. The control module controls triggering of the FET switches and floats at the high voltage of −55 kV but has its own lt power supply to operate the control circuitry.

Figure 3:
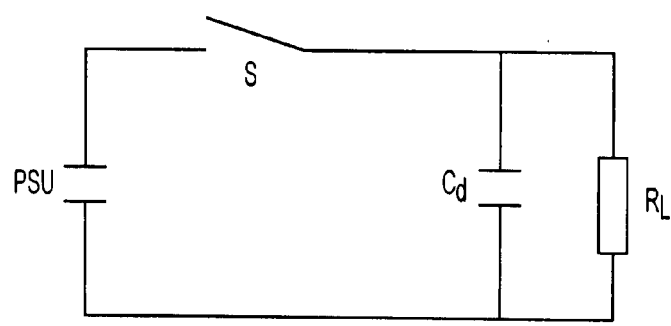
FIG. 3 (referred to previously) is a circuit diagram if a known solution to the problem.
Figure 6:
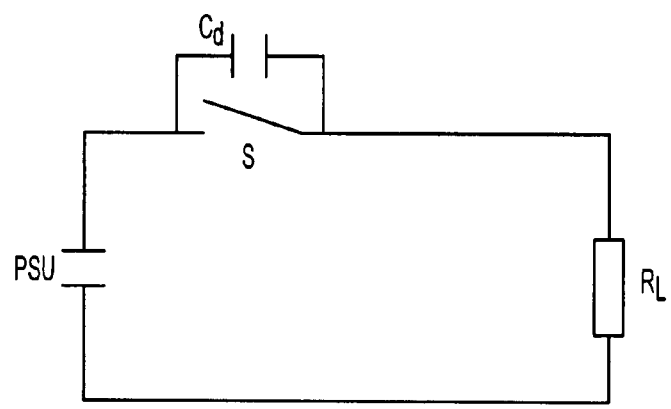
FIG. 6 is a circuit diagram of an equivalent representation of the known circuit of FIG. 3.

FIG. 6 shows an equivalent circuit to the known voltage overshoot solution in FIG. 3. In this arrangement, the compensating capacitance is placed in parallel with the switch 5.

It will be appreciated from the above description that the switch is not a single switch but a series of switches. In a typical switch stack, there may be 75 switch modules. Each of these switches have their own capacitance $C_s$ which may vary from switch to switch.

A capacitor may be placed across each of the switch modules instead of a single capacitor across the load. However, to obtain the same capacitance, the value of each capacitor must be nCd, where n is the number of switch modules, or looking at it another way, the number of series connected capacitors. The value of nCd is such that the applied capacitance greatly exceeds and swamps any stray capacitances generated at the switch.

Figure 7:
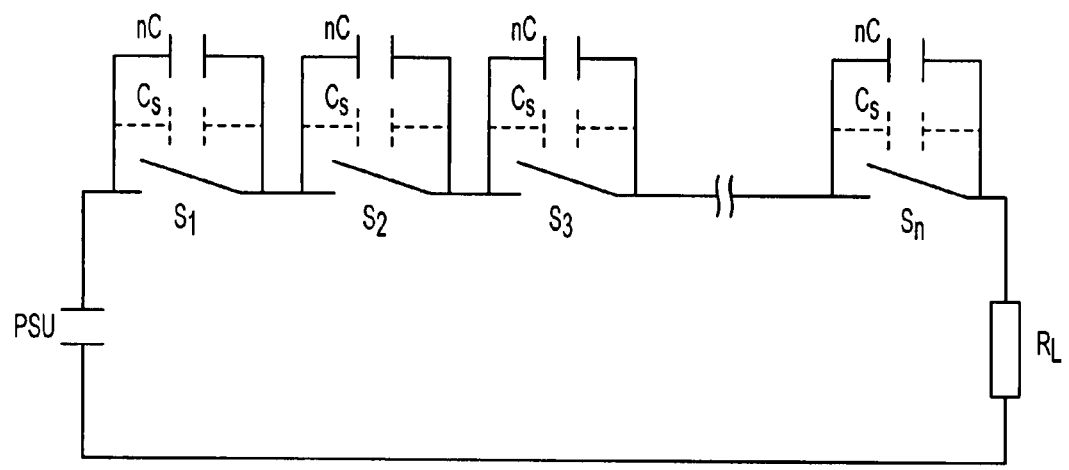
FIG. 7 shows how the capacitance of FIG. 6 may be distributed in accordance with an embodiment of the invention.

FIG. 7 shows this arrangement. In FIG. 7, each of the switches S1, S2-Sn are shown with a capacitance nCd in parallel and a further capacitance $C_s$ in phantom as the effect is minimal compared to the effect nCs.

The arrangement described has a number of advantages. First, the provision of a large number of switch capacitor reduces costs as small surface mounted capacitors may be used which are more common place and very cheap, typically in the order of about 20 p each. In contrast, a simple capacitance used in parallel with a magnetron is physically very big and expensive, typically in the order of about ±50.

Furthermore, by placing the load capacitance across the switches, the value greatly exceeds the value of any stray capacitance, which overwhelms any effect that might be caused by those stray capacitances. This enables the voltage at each switch to be the same which is highly desirable.

Various modifications to the embodiment described are possible and will occur to those skilled in the art without departing from the invention. For example, in the embodiment described, a capacitance of nCd is arranged in parallel across each switch, or switch module. As in a preferred, each switch module comprises a number M of switches arranged in parallel, the capacitance nCd may be distributed as nCd/M across each of the parallel switches. In practical realisations, this makes for a more flexible layout. The number of switches and the number of switch modules may vary as may the value of load capacitance required, depending on the nature of the load and the operating conditions.

The invention claimed is:

1. A high voltage switching arrangement for applying a pulse across a load which includes a capacitive component, said high voltage switching arrangement comprising:
   a first capacitor for providing electrical energy to the load; and
   a switch stack for connecting the first capacitor to the load, the switch stack comprising a plurality of switch modules arranged in series with the first capacitor and a plurality of load capacitances in parallel across the switch modules, the load capacitances together providing the required additional capacitance across the load to compensate for voltage overshoot.

2. A switching arrangement according to claim 1 wherein each switch module has a capacitance nCd in parallel across the switch, where Cd is the load capacitance and n is the number of switch modules.

3. A switching arrangement according to claim 2, wherein the parallel load capacitance nCd are chosen such that nCd>>$C_s$, where C is the stray capacitance of each switch.

4. A switching arrangement according to claim 1, wherein the switch module comprise FET switches.

5. A switching arrangement according to claim 4, wherein the FET switches are arranged on circuit boards, with the load capacitances, and the circuit boards are stacked in close proximity to each other.

6. A switching arrangement according to claim 1, wherein each switch module comprises a plurality of switches arranged in parallel and a capacitance of nCd/M is arranged across each switch where M is the number of switches.

7. A high voltage switching arrangement for applying a pulse across a magnetron which includes a capacitive component, said high voltage switching arrangement comprising:
   a first capacitor for providing electrical energy to the magnetron; and
   a switch stack for connecting the first capacitor to the magnetron in a series arrangement, the switch stack comprising a plurality of switch modules arranged in series and a plurality of second capacitors arranged in parallel across the switch modules where the second capacitors distribute capacitance of the magnetron across each switch module so that capacitance applied at the magnetron exceeds any stray capacitance generated at the switch stack.

8. A switching arrangement according to claim 1, wherein the load is a magnetron.

* * * * *